(12) United States Patent
Leonov et al.

(10) Patent No.: US 12,245,352 B2
(45) Date of Patent: Mar. 4, 2025

(54) PLASMA GENERATOR

(71) Applicant: Ananda Shakti Technologies Ltd., Nicosia (CY)

(72) Inventors: Vladimir Leonov, Moscow (RU); Sergei Altunin, Bryansk (RU); Oleg Kulakovskii, Saint Petersburg (RU); Haslen Matthew Back, London (GB); Valeria Tyutina, London (GB)

(73) Assignee: Ananda Shakti Technologies Ltd., Nicosia (CY)

( * ) Notice: Subject to any disclaimer, the term of this patent is extended or adjusted under 35 U.S.C. 154(b) by 61 days.

(21) Appl. No.: 17/782,968

(22) PCT Filed: Dec. 3, 2020

(86) PCT No.: PCT/EP2020/084425
§ 371 (c)(1),
(2) Date: Jun. 6, 2022

(87) PCT Pub. No.: WO2021/110812
PCT Pub. Date: Jun. 10, 2021

(65) Prior Publication Data
US 2023/0017324 A1  Jan. 19, 2023

(30) Foreign Application Priority Data

Dec. 4, 2019 (GB) .................................... 1917736

(51) Int. Cl.
| | | |
|---|---|---|
| H05H 1/24 | (2006.01) | |
| C02F 1/46 | (2023.01) | |
| C02F 103/08 | (2006.01) | |
| F24H 1/00 | (2022.01) | |
| H05H 1/46 | (2006.01) | |

(52) U.S. Cl.
CPC .......... *H05H 1/247* (2021.05); *C02F 1/4608* (2013.01); *F24H 1/0018* (2013.01); *H05H 1/466* (2021.05); *C02F 2103/08* (2013.01); *F24H 2250/10* (2013.01); *H05H 2245/20* (2021.05)

(58) Field of Classification Search
None
See application file for complete search history.

(56) References Cited

U.S. PATENT DOCUMENTS

| | | | | |
|---|---|---|---|---|
| 3,290,723 | A * | 12/1966 | Jaques | H05H 1/42 425/383 |
| 3,884,718 | A * | 5/1975 | Deaton | G21H 1/00 976/DIG. 410 |
| 5,948,283 | A * | 9/1999 | Grosshart | H01J 37/32715 118/724 |
| 7,589,473 | B2 * | 9/2009 | Suslov | A61B 18/042 315/111.21 |

(Continued)

OTHER PUBLICATIONS

Leonov, V., et al., PCT/EP2020/084425, International Search Report, Mar. 22, 2021, 6 pages.

(Continued)

*Primary Examiner* — Srinivas Sathiraju
(74) *Attorney, Agent, or Firm* — Rahman LLC

(57) ABSTRACT

A plasma generator includes a cathode, an anode, and a stabilizing electrode. The stabilizing electrode stabilises a region of plasma within a fluid. Methods of plasma generation and uses thereof are also provided.

39 Claims, 7 Drawing Sheets

(56) References Cited

U.S. PATENT DOCUMENTS

| | | | | |
|---|---|---|---|---|
| 8,735,766 | B2* | 5/2014 | Suslov | H05H 1/34 |
| | | | | 315/111.21 |
| 9,957,170 | B2* | 5/2018 | Nakamura | C02F 1/4608 |
| 11,545,372 | B2* | 1/2023 | Yoo | H01L 21/67051 |
| 2004/0049251 | A1* | 3/2004 | Knowlton | A61B 17/32093 |
| | | | | 607/101 |
| 2005/0139463 | A1* | 6/2005 | McClure | C10G 1/00 |
| | | | | 422/186.04 |
| 2009/0147434 | A1* | 6/2009 | Gabara | H02N 13/00 |
| | | | | 361/233 |
| 2009/0147437 | A1* | 6/2009 | Gabara | H01G 5/16 |
| | | | | 361/281 |
| 2009/0148932 | A1* | 6/2009 | Gabara | G01N 13/02 |
| | | | | 250/227.3 |
| 2012/0123318 | A1* | 5/2012 | Ek | A61N 1/0476 |
| | | | | 604/20 |
| 2014/0323948 | A1* | 10/2014 | Ek | A61N 1/325 |
| | | | | 604/20 |
| 2015/0225264 | A1* | 8/2015 | Fujikane | C02F 1/50 |
| | | | | 210/192 |
| 2015/0251933 | A1* | 9/2015 | Nakamura | C02F 1/4608 |
| | | | | 210/192 |
| 2015/0307370 | A1* | 10/2015 | Kang | C02F 1/4608 |
| | | | | 205/756 |
| 2017/0327390 | A1* | 11/2017 | Imada | C02F 1/4608 |
| 2018/0191033 | A1* | 7/2018 | Wessells | H01M 10/056 |
| 2018/0338713 | A1* | 11/2018 | Polsky | A61B 5/157 |
| 2019/0109347 | A1* | 4/2019 | Wessells | H01M 10/36 |
| 2020/0346002 | A1* | 11/2020 | Schouenborg | A61L 31/022 |
| 2023/0017324 | A1* | 1/2023 | Leonov | H05H 1/247 |

OTHER PUBLICATIONS

Leonov, V., et al., PCT/EP2020/084425, Written Opinion, Mar. 22, 2021, 6 pages.

* cited by examiner

PLASMA GENERATOR

FIELD OF THE INVENTION

The invention relates to plasma generators, wherein a plasma is stabilized by a stabilizing electrode. This provides for the improvement of methods for the treatment of fluids, including liquids, for example water and water mixtures, using an electrical plasma discharge.

BACKGROUND OF THE INVENTION

There are many different ways of treating water using an electrical discharge, including utilising the ability to form a plasma discharge. To create a plasma discharge in a fluid, various electrode designs may be used, consisting mainly of a cathode and an anode or several cathodes and various configurations of anodes. Methods for water treatment by electrical discharges and various electrode systems are described in a paper by P. Vanraes, A. Y. Nikiforov and C. Leys, *"Electrical Discharge in Water Treatment Technology for Micropollutant Decomposition"*, in Plasma Science and Technology (2016): pp. 429-78, the contents of which are incorporated herein by reference.

More specifically, plasma discharges are often formed in liquids. However, existing methods of forming a plasma discharge in a liquid lead to instability of the plasma discharge between two electrodes, i.e. a cathode and an anode, due to the destabilizing effect of the of electric current flow through the liquid between the electrodes. When supplied with direct current voltage, plasma discharge is formed around the cathode, which has a negative electric potential. The cathode can be made from a refractory material in the form of rods or needles (however other shapes and geometries can be used), at the ends of which a high electric potential gradient and high intensity electric field is created.

The concentration of the electric field at the end of the cathode leads to the initiation of the plasma discharge around the cathode, similar to the burning of an electric corona in air at the tip of a corona electrode. However, whereas an electric corona in air (gas) has a single-phase medium, a plasma discharge in a liquid is characterized by a two-phase system: gas-vapor and liquid. In particular, the gas-vapor area (phase) is formed around the cathode inside the liquid in which the cathode is located.

As the voltage on the cathode increases, a gas vapor bubble forms in the liquid around the cathode as the liquid is heated to a temperature above boiling. The heating of the liquid is caused by both the presence of conduction currents in the liquid and electrical currents of the plasma at the cathode. There is no clear phase boundary between the gas vapor area of the bubble and the surrounding liquid. Instead, the phase boundary is blurred and has strong and complex thermal and electrical fluctuations. This leads to instability in the plasma around the cathode in the liquid, and causes periodic breakdowns of the plasma discharge. Electrical breakdown of the plasma is dramatically weakened, then amplified, which is characterized by sharp jumps in the electrical current in the power circuit of the electrodes in the liquid.

The instability of the plasma discharge in liquids is due to the fact that the gas vapor bubble around the cathode has poor electrical conductivity (high electrical resistance), while the liquid medium has sufficient electrical conductivity for the passage of electrical currents. The electrical circuit for a two-phase medium (gas-vapor and liquid) can be represented as two active electrical resistances, one of which characterizes the gas-vapor area, and the second the liquid medium. A sharp increase in the electrical resistance of the gas-vapor phase leads to a decrease in the plasma discharge current and the breakdown of the plasma discharge. As a result, the plasma discharge decays or extinguishes completely.

To re-initiate the plasma discharge or increase its intensity, it is necessary to increase the voltage between the cathode and the anode. However, the increase in voltage leads to electrical breakdown between the cathode and the anode, a sharp increase in current and ultimately arcing between the anode and the cathode. This can cause the cathode to almost instantly burn out, damaging the cathode irreparably, which requires repair of the device.

It would therefore be desirable to develop a new technique that addresses one or more of the above issues.

US 2010/0219136 A1, WO 2016/044239 A1, and US 2015/0307370 A1 describe methods of improving the efficiency of plasma treatment of a liquid. However, all of these methods produce unstable initiation and sustainment of a plasma discharge. US 2010/0219136 A1 relates to fluid treatment using plasma technology, in which plasma initiation in a liquid is carried out through an air spark gap. However, the spark gap does not provide a stable plasma discharge, since the mode of operation is designed for simultaneous electric spark breakdown of the air gap and the liquid. In this case, the main energy release occurs in a spark gap in air, (i.e. before the plasma discharge in the liquid), potentially reducing the efficiency of liquid processing. JP 2017/205755 describes methods to improve the stability of a plasma discharge between a first and a second electrode. Specifically, precipitates that form on the second electrode and impact the stability and efficiency of the plasma discharge, are transferred to the surface of a third electrode under the action of an applied voltage across the second and third electrode. The third electrode may then be discarded and replaced.

It is desirable that the invention increase the stability of the plasma initiation and maintenance of an electrical plasma discharge in a liquid.

In comparison with known methods, the proposed invention allows for a high stability of both the initiation and maintenance of a plasma discharge in a liquid medium, eliminating electrical breakdown of the liquid and damage to the cathode due to arcing, requiring the cathode to be repaired or replaced, with associated costs and delays.

SUMMARY OF THE INVENTION

There is provided a plasma generator and a method for plasma generation within a fluid according to the appended claims. Without being bound by theory, when the plasma generator is in use, a time varying electric field may be applied across a fluid-filled gap. This electric field is believed to create a maximum volume of plasma. Any duration of high electrical stress can be managed in order to deter deleterious currents forming at the electrodes.

The invention relates to the improvement of methods for treating water and water mixtures, for example, bases and acids, as well as other liquids, by electrical plasma discharge in various technological processes: water and wastewater treatment, disinfection, electrochemistry, catalysis, electroplating, heating, steam generation, desalination, decomposition, destruction, synthesis, mixing and many other technologies.

Specifically, the plasma generator of the invention comprises a cathode, an anode, and a stabilizing electrode, wherein the stabilizing electrode stabilises a region of plasma within a fluid.

Initiation and stabilization of a plasma discharge in a fluid, particularly the creation of a plasma discharge in a fluid to form a two-phase gas vapor-phase and liquid-phase areas separated by an interface between two potential electrodes (i.e. the cathode and the anode), may be performed by stabilizing the interface between the gas vapor and liquid areas using the stabilizing electrode. As such, the stabilizing electrode stabilises a region of plasma discharge within the fluid. Specifically, the stabilizing electrode may stabilise an interface between the region of plasma discharge and the fluid. As used herein, the term "stabilize", and analogous terms, is intended to mean that the interface between the region of plasma and the fluid is maintained in order to minimize thermal and electrical fluctuations at the interface.

The stabilizing electrode may initiate the plasma discharge, and subsequently perform a stabilizing/sustaining function by inhibiting the collapse of the discharge. The stabilizing electrode will often be positioned between the cathode and the anode. Optionally, the stabilizing electrode may be positioned on either the anode or the cathode, and, in this case, the stabilizing electrode is isolated from the cathode and/or the anode. As used herein, the term "between" is intended to be given its normal meaning in the art, referring specifically to locations where the stabilizing electrode may intercept and interact with the plasma discharge, thus allowing this electrode to perform its stabilizing function. The plasma discharge is produced between the cathode and the stabilizing electrode. Further, such configurations allow the plasma discharge to be confined between the stabilizing electrode and the cathode.

The stabilizing electrode may emit charged particles, such as seed electrons, into the fluid, thereby enhancing both the initiation and sustainment of the plasma discharge.

Optionally, one or more power supply configurations may be coupled across the electrodes (i.e. the cathode, anode and stabilizing electrode), forming a circuit. For instance, a high voltage direct current (DC) power supply may be coupled to the cathode and to the anode. Additionally, a high frequency alternating current (AC) power supply may be coupled to the cathode and to the stabilizing electrode. However, in some plasma conditions, the stabilizing electrode may be unpowered, and so not be coupled to the high frequency AC power supply. Alternatively, in some plasma conditions, the coupling between the high frequency AC power supply and the stabilizing electrode may be inactive, or periodically inactive, such that power is supplied only when a need for stabilization is detected. The initiation and stabilization process of the plasma discharge is intensified by using a high frequency high voltage spark discharge between the cathode and the stabilizing electrode, with a current of the spark-discharge that is lower than the plasma discharge current (supplied by the DC power supply). In a related manner, the electric potential of the high-frequency high-voltage spark discharge is set higher than the electric potential of the plasma discharge at the cathode. Additionally or optionally, the power supply to the cathode and to the anode can be either AC, DC or of an impulse nature. Additionally, or optionally, the power supply to the stabilizing electrode can be either DC or of an impulse nature.

The stabilizing electrode may adopt one of many shapes, depending on the most suitable configuration for a particular given application. For example, the stabilizing electrode may be formed in the shape of a plate, a sphere, a rod, or combinations thereof. Optionally, the stabilizing electrode may have a curved shape (e.g. a curved plate, or "bowl" shape), such as a curved semi-elliptical shape, which may be convex or concave when viewed with respect to the cathode. Equally, the stabilizing electrode may be configured to be substantially flat, square, elliptical, or parabolic. It will often be the case that shapes of generally large cross-section in two axes are selected as these facilitate the interaction with and stabilization of the plasma efficiently. As such, rods or plates are often selected.

The stabilizing electrode will often be porous. For example, the stabilizing electrode may have perforations along its surface. These perforations may extend completely through the surface of the stabilizing electrode, or may take the form of surface indentations that extend only partially into the surface of the stabilizing electrode. The perforations allow the passage of charged particles and molecules within the fluid through the surface of the stabilizing electrode and out of the system to collection points. Alternatively, the stabilizing electrode may be nonporous and impermeable.

Returning to the power supply configurations outlined above, a decoupling inductor may optionally be interposed between the high voltage DC power supply and the cathode. The decoupling inductor acts to protect the DC power supply, by blocking alternating current and high frequency signals associated with AC power supply from reaching, and potentially damaging, the high voltage DC power supply. Alternatively, the decoupling inductor may be interposed between the high voltage DC power supply and the anode. In principle, the decoupling inductor may be interposed at any suitable position within the circuit provided the decoupling inductor is in a series arrangement with the cathode and anode.

Additionally, and optionally, a decoupling capacitor may be interposed between the high frequency AC power supply and the cathode. The decoupling capacitor acts to protect the AC power supply, by blocking direct current associated with the DC power supply from reaching, and potentially damaging, the AC power supply. Alternatively, the decoupling capacitor may be interposed between the high voltage DC power supply and the anode. In principle, the decoupling capacitor may be interposed at any suitable position within the circuit provided the decoupling inductor is in a series arrangement with the cathode and anode. To regulate the current flowing between the cathode, anode and stabilizing electrode, various switching elements may be implemented. These switching elements may include, but are not limited to, solid state, electrovacuum and electronic switching elements.

The plasma generator may optionally comprise an inlet for delivering a catalyst to the region of plasma discharge. The catalyst may be delivered into the fluid and subsequently be delivered to the region of plasma discharge via the flow of the fluid. The catalyst may facilitate and enhance chemical reactions within the plasma generator, thereby increasing the efficiency of treatment of the fluid with the plasma discharge.

In one example the fluid within the plasma generator may be water, or may be an aqueous solution. The action of the plasma discharge on the water may cause heating of the water, or it may promote reaction of the solute (with, or without the aid of a catalyst). Optionally, the plasma generator may be coupled to a heat exchanger. Any excess heat energy produced in the fluid as a result of the aforementioned treatment of the fluid with the plasma discharge may be transferred away from the plasma generator using the heat exchanger. As such the excess heat energy can be used for other purposes, and is not wasted.

In another example, the aqueous solution may be a saline solution. The treatment of saline solution with the plasma discharge may desalinate the saline to produce water. Further, the desalination of the saline solution with the plasma discharge may produce potable water.

Unless otherwise stated, each of the integers described may be used in combination with any other integer as would be understood by the person skilled in the art. Further, although all aspects of the invention preferably "comprise" the features described in relation to that aspect, it is specifically envisaged that they may "consist" or "consist essentially" of those features outlined in the claims. In addition, all terms, unless specifically defined herein, are intended to be given their commonly understood meaning in the art.

Further, in the discussion of the invention, unless stated to the contrary, the disclosure of alternative values for the upper or lower limit of the permitted range of a parameter, is to be construed as an implied statement that each intermediate value of said parameter, lying between the smaller and greater of the alternatives, is itself also disclosed as a possible value for the parameter.

In addition, unless otherwise stated, all numerical values appearing in this application are to be understood as being modified by the term "about".

In order that the invention may be more readily understood, it will be described further with reference to the figures and to the specific examples hereinafter.

DETAILED DESCRIPTION

Figure 1:
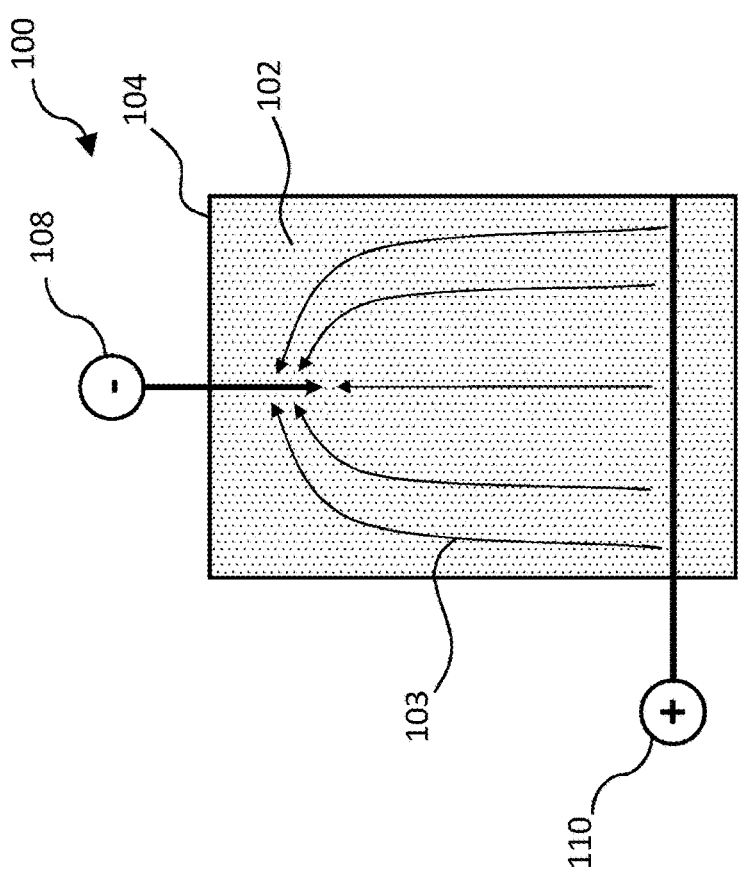
FIG. 1 shows a prior art system of electrodes (cathode and anode) for the formation of a plasma discharge in a liquid.

Embodiments of the invention will be now described with reference to the attached Figures. It is to be noted that the following description is merely used for enabling the skilled person to understand the invention, without any intention to limit the applicability of the invention to other embodiments which could be readily understood and/or envisaged by the reader. FIG. 1 illustrates a generator 100 for forming a plasma discharge in a fluid. FIG. 1 shows a body of fluid 102 within vessel 104. Vessel 104 may be any suitable structure capable of containing fluid 102. A cathode 108 and an anode 110 are installed within the vessel 104, and are in contact with the body of fluid 102, which may be a liquid. Optionally, fluid 102 may be water. FIG. 1 also illustrates the release and migration of cations from anode 110 towards cathode 108, signified by arrows 103. In the specific example of the electrolytic decomposition of water, the cations are $H^+$ ions.

An electric potential of negative polarity is supplied to the cathode 108, and an electric potential of positive polarity is applied to the anode 110. For electrical safety, the anode 110 is grounded. Since plasma discharges can have a high heating temperature, the cathode 108 may be made of a refractory material. The anode 110 can be produced from various materials, in particular materials which exhibit resistance to damage and destruction in electrolytic reactions in a liquid medium, such as nickel or titanium for example.

Figure 2:
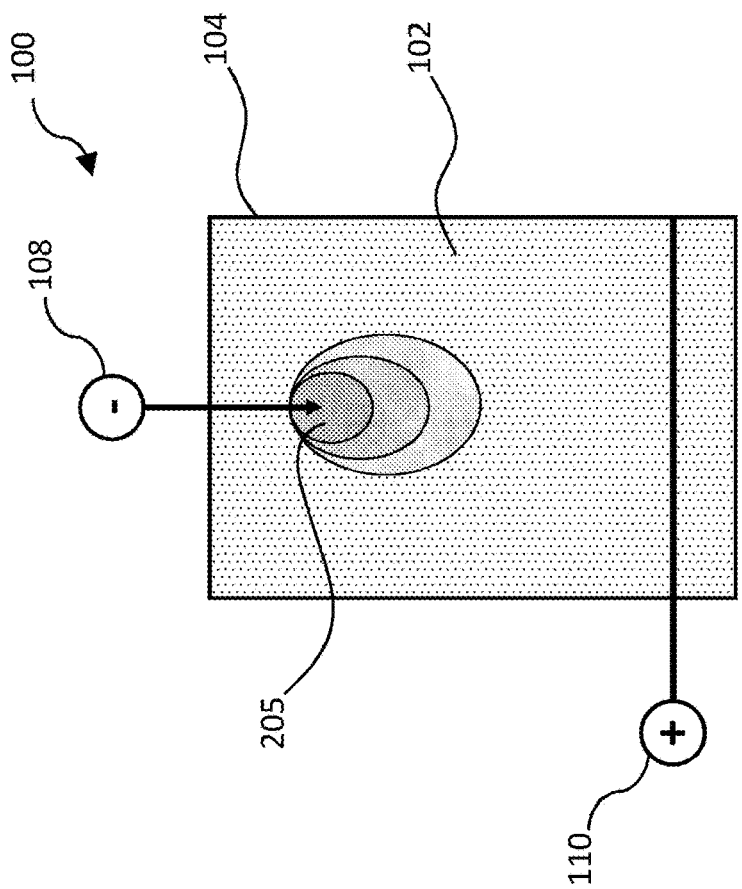
FIG. 2 shows a two-phase scheme of a plasma discharge in a liquid, consisting of a vapor phase propagating through a liquid phase, in the system of FIG. 1.

FIG. 2 illustrates the formation of a gas bubble 205 formed at a cathode 108, and the propagation of the gas bubble 205 in a fluid 102. A non-uniform high-voltage electric field is created at the end of cathode 108 to initiate the plasma discharge in fluid 102. The cathode 108 may be in the form of a rod or a needle. As the voltage across the cathode 108 and the anode 110 increases an electric conduction current flow from the cathode 108 (electrons and ions), and a gas vapor bubble 205 forms in the liquid around the cathode as the fluid 102 is heated. The heating of the fluid may be to a temperature above boiling. The heating of the fluid 102 is caused by both the presence of conduction currents in the fluid 102 and electrical currents of plasma discharge formed at the cathode 108. As a result of electrolytic decomposition of water, atomic hydrogen is released at anode 110, and hydroxyl anions are released at the cathode 108, which then react to form hydrogen ($H_2$) and oxygen ($O_2$). The propagation of electric field lines and electric ion currents from the anode to the cathode (for example of H+ ions) are signified by arrows in FIG. 1.

During the plasma discharge, a two-phase substance consisting of a gas vapor phase in the form of a gas vapor bubble 205 and a liquid phase is formed in the fluid. In particular, the gas-vapor area (phase) is formed around the cathode 108 inside the fluid 102 in which the cathode 108 is located. The surface of the gas vapor bubble 205 is the boundary between the phases, as shown by FIG. 2. The electrical properties of conductivity inside the gas-vapor bubble 205 and the liquid phase 102 are very different. The electrical conductivity of the gas vapor bubble 205 is determined by the ionization of, and mobility of ions in, the gas vapor mixture inside the bubble 205, while the electrical conductivity of the liquid phase 102 is determined by the ionization of molecules, chemical composition and physical properties of the liquid phase. The plasma discharge occurs inside the gas vapor bubble 205. The plasma discharge emits strong visible and infrared radiation, causing luminescence including luminescence of the fluid 102. As mentioned, inside the liquid phase currents flow, and these currents cause thermal heating of the liquid phase.

There is no clear phase boundary between the gas vapor area of the bubble 205 and the surrounding liquid phase 102. Instead, the phase boundary is blurred and has strong thermal and electrical fluctuations, which lead to instability of the plasma discharge around the cathode 108 in the liquid phase, and cause periodic breakdown of the plasma discharge. The plasma discharge is dramatically weakened, then amplified, which is characterized by sharp jumps in the electrical current across the cathode 108 and anode 110.

Similar to what is observed in a corona discharge in a gas, plasma discharge occurs inside the gas vapor bubble 205 only at high conduction currents. The gas vapor bubble 205, under the action of the plasma discharge, rapidly heats up and subsequently increases in volume, as shown by the expanding concentric ellipses in FIG. 2. The electrical resistance inside the gas vapor bubble increases, reducing current in the plasma discharge to its extinction, and the gas vapor bubble 205 subsequently cools and bursts. This process is repeated, leading to instability of plasma discharge, which initiates and extinguishes periodically and rapidly. At the same time, the electric current in the plasma discharge also has a pulsating character, causing instability of the discharge of the pulsating plasma. The instability of the plasma discharge adversely affects the efficiency of the treatment of the fluid 102.

Figure 3:
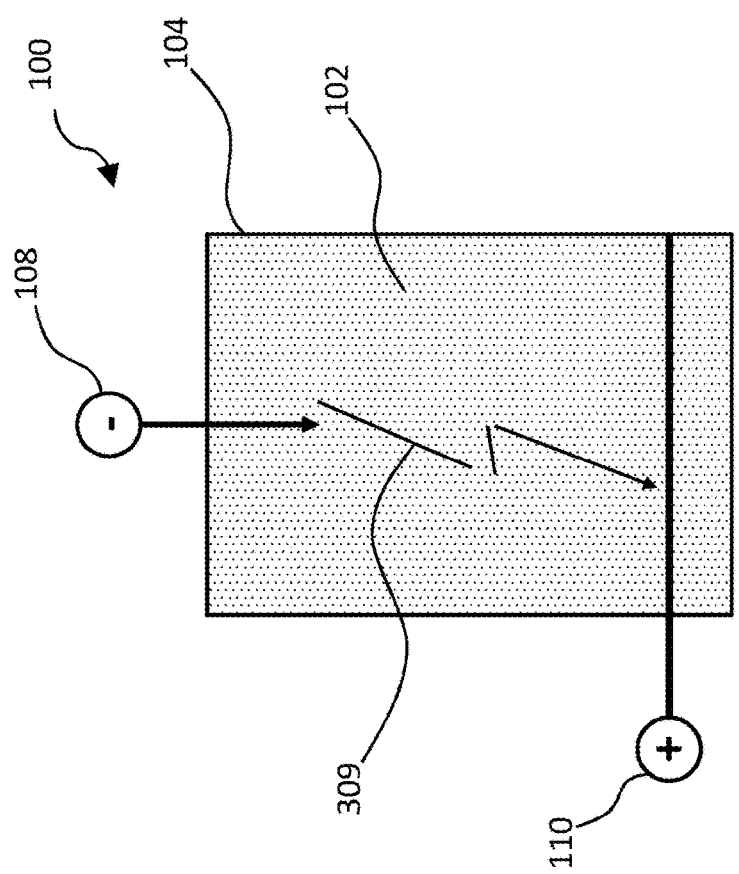
FIG. 3 shows a scheme of the electrical arc breakdown in a fluid between a cathode and an anode, in the system of FIG. 1.

The stability of the plasma discharge can be increased by increasing the voltage across the electrodes 108, 110 in order to increase the number of charge carriers inside the gas-vapor bubble 205, thus reducing the electrical resistance of the bubble 205. However, FIG. 3 shows that increasing the voltage across the cathode 108 and anode 110 leads to electrical breakdown of the fluid 102, and shorting between the anode 108 and cathode 110 due to the formation of an arc discharge 309. Arc 309 can cause burnout of, and irreparable damage to, cathode 108, requiring repair or replacement of cathode 108.

Figure 4:
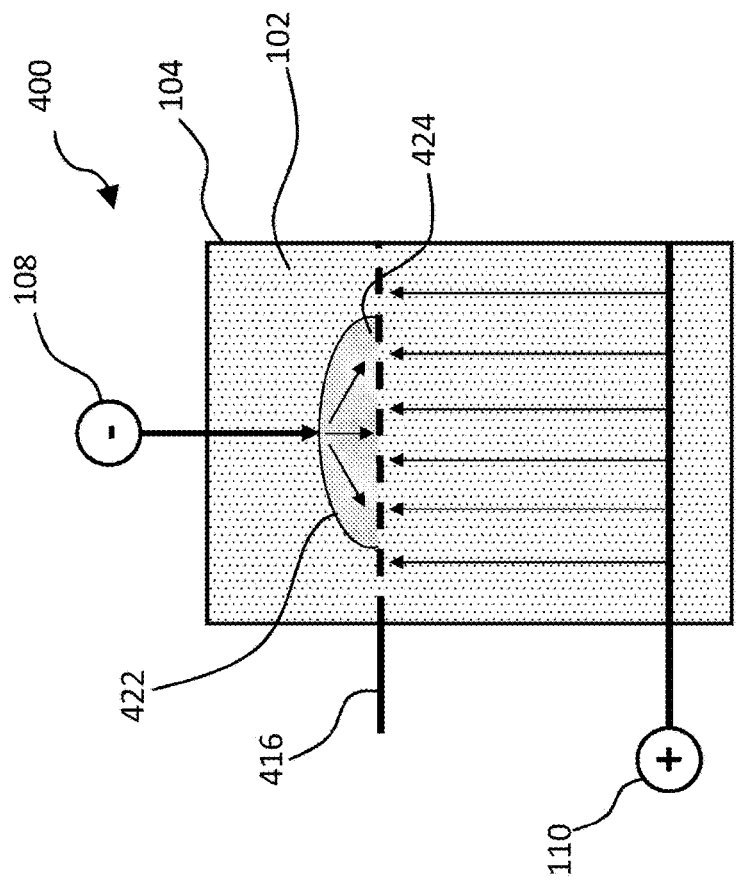
FIG. 4 shows a scheme of installation of a stabilizing electrode between a cathode and an anode.

To overcome the deficiencies outlined above in existing methods of igniting plasma discharges in liquids between a pair of electrodes 108, 110, the claimed invention proposes to confine the interface between the gas-vapor area and liquid by installing an additional stabilizing electrode 416. FIG. 4 illustrates an electrode configuration 400 showing the installation of an additional stabilizing electrode 416 between the cathode 108 and the anode 110. In the example shown in FIG. 4, the stabilizing electrode 416 is shown interposed across the full width of the vessel 104, and positioned closer to the cathode 108 than the anode 110. However, the position of the stabilizing electrode 416 shown by FIG. 4 is purely illustrative, and the stabilizing electrode may be interposed in any suitable position between cathode 108 and anode 110. Similarly, the stabilizing electrode 416 may only extend partially across the width of the vessel 104 if required. As used herein, the term "between" is intended to be given its normal meaning in the art, referring specifically to locations where the stabilizing electrode 416 will intercept and interact with the plasma discharge 424, thus allowing it to perform its stabilizing function.

A plasma discharge 424 is produced within gas bubble 422 and between the cathode 108 and the additional stabilizing electrode 416. In this case, the additional stabilizing electrode 416 stabilizes the plasma discharge 424 by confining it, i.e. by locally fixing the volume of the plasma discharge 424 and gas bubble 422. Confining the volume of the plasma discharge 424 and gas bubble 422 using the stabilizing electrode 416 overcomes the previously discussed gas bubble volume instabilities that lead to bursting of the gas-vapor bubble and extinguishment of the plasma discharge.

As mentioned above in connection with FIG. 2, the heating of the liquid is caused in part by electrical currents within the plasma discharge 424 formed at the cathode 108. In a single-cathode arrangement, such as that shown by FIG. 4, the amount of current that can be allowed to flow through plasma discharge 424 in gas bubble 422 is somewhat limited in order to prevent thermal damage to the cathode 108. This defines a maximum fluid treatment efficiency that is achievable using a single cathode configuration.

Figure 5:
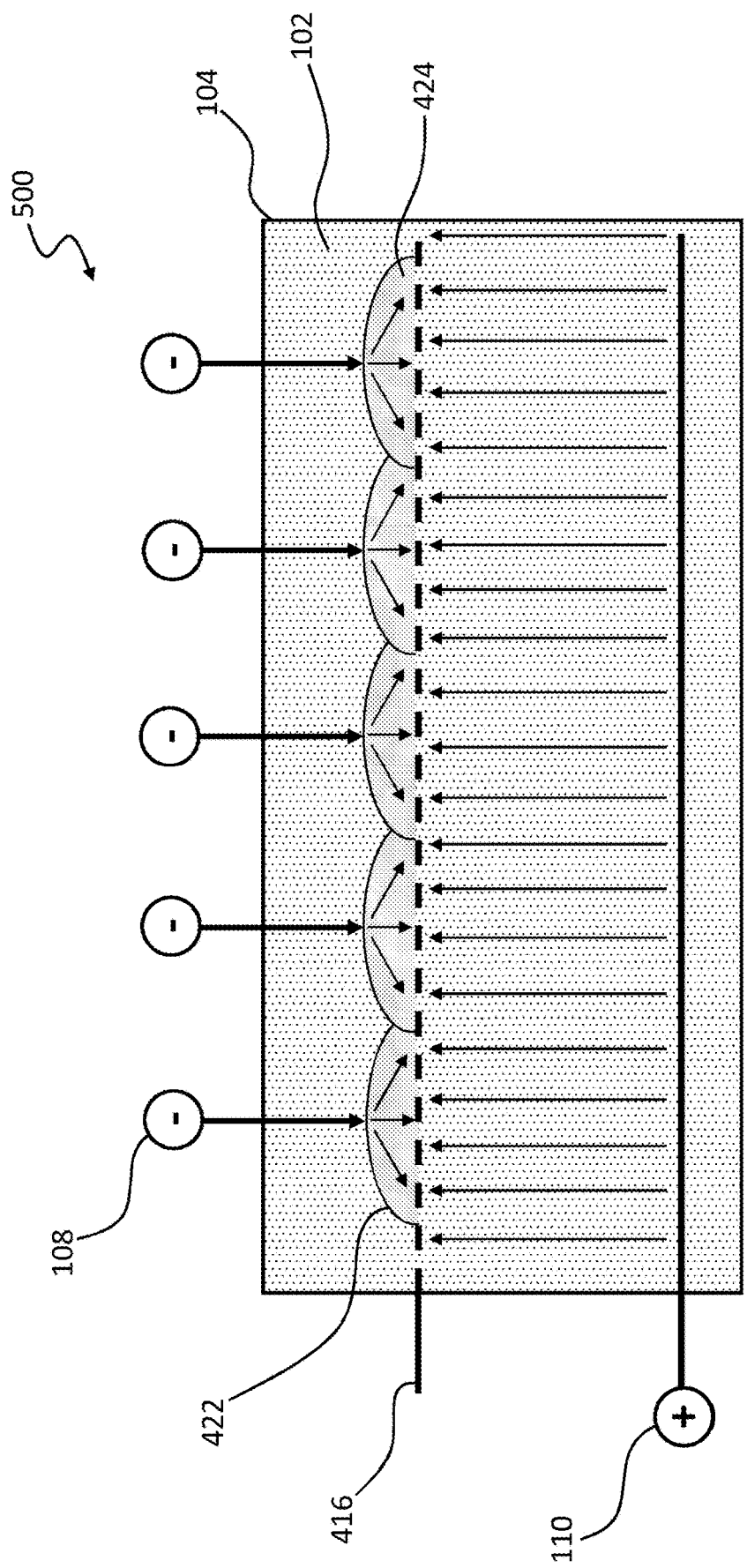
FIG. 5 shows a multi-discharge system consisting of multiple cathodes coupled to a common stabilizing electrode and a common anode.

FIG. 5 illustrates a system 500 involving an array of cathodes 108 (such as cathode 108 shown in FIG. 4) coupled to a common stabilizing electrode 416. A plasma discharge 424 is initiated in a gas bubble 422 between the common stabilizing electrode 416 and each respective cathode 108. The scheme shown by FIG. 5 is designed to increase the level of fluid treatment efficiency by overcoming the aforementioned issues which may be experienced with single cathode arrangements. In FIG. 5, the cathodes 108 are installed in such a way as to form a continuous area of the plasma discharge 424 on the surface of the stabilizing electrode 416, as the boundaries of the gas bubbles 422 formed between the common stabilizing electrode 416 and each respective cathode 108 merge to form a quasi-continuous gas bubble and sheet-like plasma discharge. This increases the volume of the fluid 102 that can be treated in a single application. Whilst FIG. 5 illustrates an example involving five individual cathodes 108, in reality any number of cathodes 108 could be implemented together with a common stabilizing electrode 416.

Figure 6:
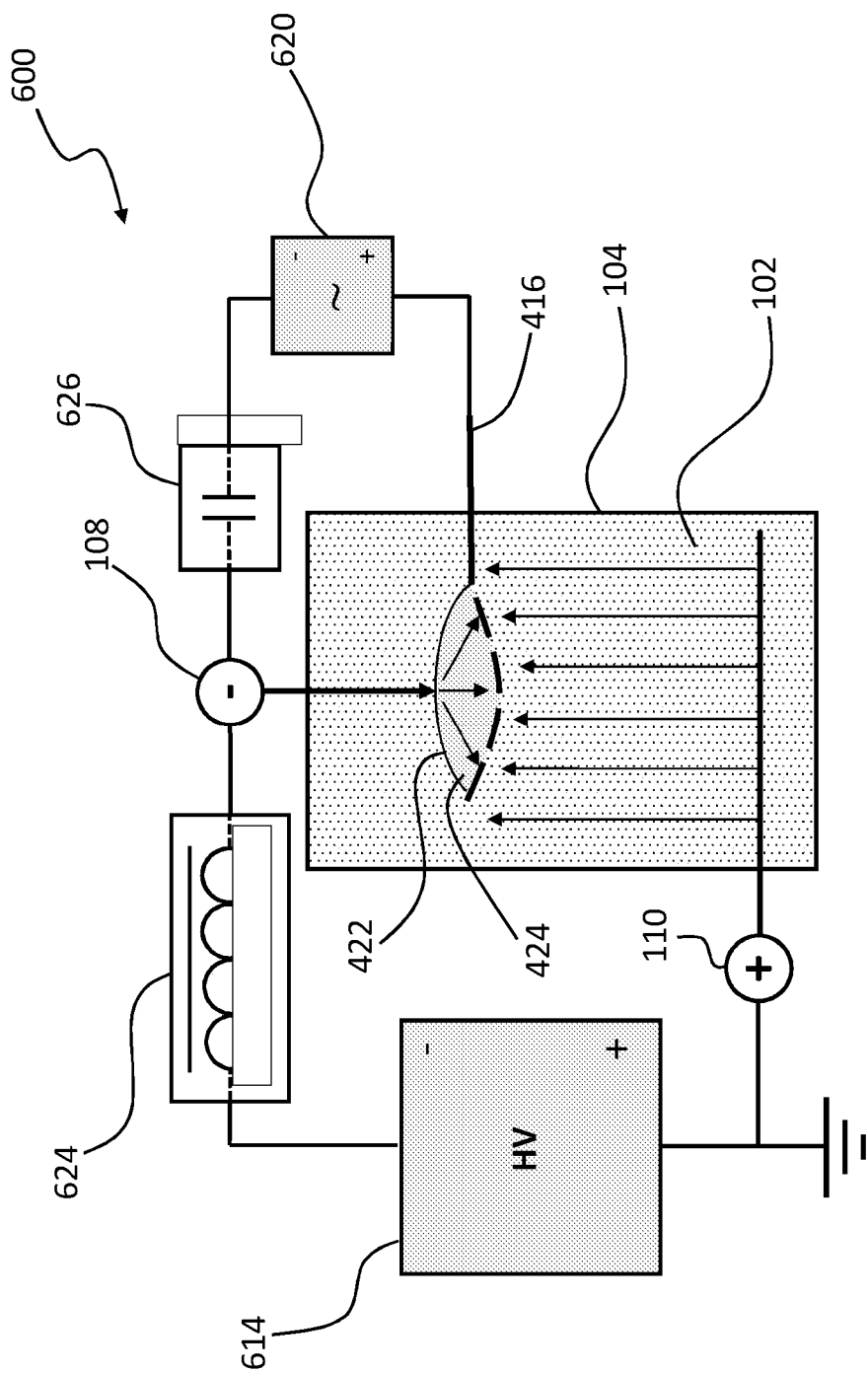
FIG. 6 is a diagram illustrating power supplying components and circuitry coupled to the cathode, anode and stabilizing electrode.

FIG. 6 is an illustrative block diagram 600 that depicts electrical components that may be coupled to the electrodes 108, 110, 416, shown in FIG. 4 or 5. FIG. 6 shows a constant high voltage HV direct-current (DC) power supply 614 coupled to the cathode 108 and anode 110. Power supply 614 is operated at voltages on the order of, for example, >1 kV (often in the range 1-20 kV or 5-10 kV), and, for example, at currents of >1 A (often in the range 1 A-5 A). Additionally, a high-frequency high-voltage alternating current (AC) power supply 620 is coupled to the cathode 108 and the stabilizing electrode 416. AC power supply 620 may be operated, for example, at voltages on the order of 5-10 kV, at currents on the order of 0.02-0.10 A, and at frequencies on the order of 5-30 kHz. Optionally, depending upon plasma conditions, the stabilizing electrode 416 may be unpowered, and in such cases, the high-frequency high-voltage AC power supply 620 may be inactive or absent. Alternatively, in some plasma conditions, the coupling between the high frequency AC power supply 620 and the stabilizing electrode 416 may be inactive, such that the power supply may be switched on and off when needed. In the event the high-frequency high-voltage AC power supply 620 is inactive or absent, the stabilizing electrode becomes insulated from the rest of the circuit, and is only capacitively connected to the circuit. As such, the stabilizing electrode can float passively.

When igniting the plasma discharge 424 in a saline solution or other electrolyte (for example, an alkali or acid), DC power supply 614 can be operated at voltages on the order of, for example, 0.1-0.5 kV, and at currents on the order of, for example, 15-25 A. The voltage provided by DC power supply 614 can be adjusted by pulse-width modulation with a pulsed supply voltage.

The stabilizing electrode 416 may be a plate, a rod, a sphere, or combinations thereof. In the example of FIG. 6, the stabilizing electrode 416 is shown having a curved semi-elliptical shape, which is convex with respect to the cathode 108. Equally, stabilizing electrode 416 may be configured to be substantially flat, square, elliptical, or parabolic. The stabilizing electrode 416 may be curved in a concave or convex manner, for example with respect to cathode 108.

The stabilizing electrode 416 may be porous. In the example shown by FIG. 6, the stabilizing electrode 416 has perforations along its surface. In a preferred example, these perforations may extend completely through the surface of the stabilizing electrode 416, however the perforations take the form of surface indentations that extend only partially into the surface of the stabilizing electrode 416. The stabilizing electrode may be made from a conductive material, for example a conductive metal, or may be made from a ceramic material. For example, the stabilizing electrode may be a sintered ceramic material. Suitable stabilizing electrode materials include, for example, tungsten, tungsten-ceramic composites, silicon carbide, and combinations thereof.

A decoupling inductor 624 is optionally interposed between cathode 108 and DC power supply 614. Decoupling inductor 624 protects the DC power supply 614, by blocking alternating currents and high frequency signals associated with AC power supply 620 from reaching DC power supply 614. Alternatively, the decoupling inductor 624 may be interposed between the DC power supply 614 and the anode 110. In principle, the decoupling inductor 624 may be interposed at any suitable position within the circuit provided the decoupling inductor 624 is in a series arrangement with the cathode 108 and anode 110.

A decoupling capacitor 626 is optionally interposed between cathode 108 and AC power supply 620. Decoupling capacitor 626 protects the AC power supply 620, by blocking direct currents associated with DC power supply 614 from reaching AC power supply 620. Alternatively, the decoupling capacitor 626 may be interposed between the DC power supply 614 and the anode 110. In principle, the decoupling capacitor 626 may be interposed at any suitable position within the circuit provided the decoupling capacitor 626 is in a series arrangement with the cathode 108 and anode 110.

With reference to FIG. 6, a proposed method of initiation and stabilization of a plasma discharge in a liquid is given as follows. When power is supplied by DC power supply 614 and AC power supply 620 to cathode 108, a gas-vapor bubble forms at the cathode 108. The high-frequency AC power supply 620 initiates an electric spark breakdown between the cathode 108 and the stabilizing electrode 416, leading to the propagation of a plasma streamer through the gas bubble 422, in which a narrow channel conductive spark or streamer is formed. It is through this streamer that the plasma discharge itself 424 occurs. The narrow channel conductive spark may have a diameter of, for example, 0.1-0.3 mm, and the plasma discharge may have a diameter of, for example, 10-30 mm or more. In the event that the plasma discharge 424 becomes extinguished, another high-frequency spark discharges automatically between the cathode 408 and the stabilizing electrode 416, allowing the plasma discharge to be restored in the fluid 102. The plasma discharge 424 between the cathode 108 and the stabilizing electrode 416 is initiated by a spark discharge current, which acts as a precursor for the plasma discharge current (which is provided by the DC power supply). The spark discharge current is lower than the plasma discharge current. Consequently, the electric potential of the high-frequency high-voltage spark discharge is set higher than the electric potential of the plasma discharge at the cathode 108. Thus, the process of initiation and stabilization of the electrical breakdown of the plasma discharge 424 in the liquid is sustained automatically, ensuring operability of the proposed method.

The operation of the device shown in FIG. 6 recalls the work of a thyratron, which is a type of gas-discharge lamp. A thyratron is controlled via a controlling electrode, similar to plasma control achieved in the proposed method and device using stabilizing electrode 416. The difference is that the plasma discharge 424 of the claimed invention is controlled by an additional stabilizing electrode 416 by high voltage and low current from high-frequency AC power supply 620. Here, a small high-frequency discharge current controls a high plasma initiation current and maintains its stable electrical breakdown.

A more specific implementation of the proposed method of initiation and stabilization of the electrical breakdown of the plasma discharge in a liquid is provided by two non-limiting examples of device designs for plasma processing of a liquid that follow.

Exemplary Device 1

Figure 7:
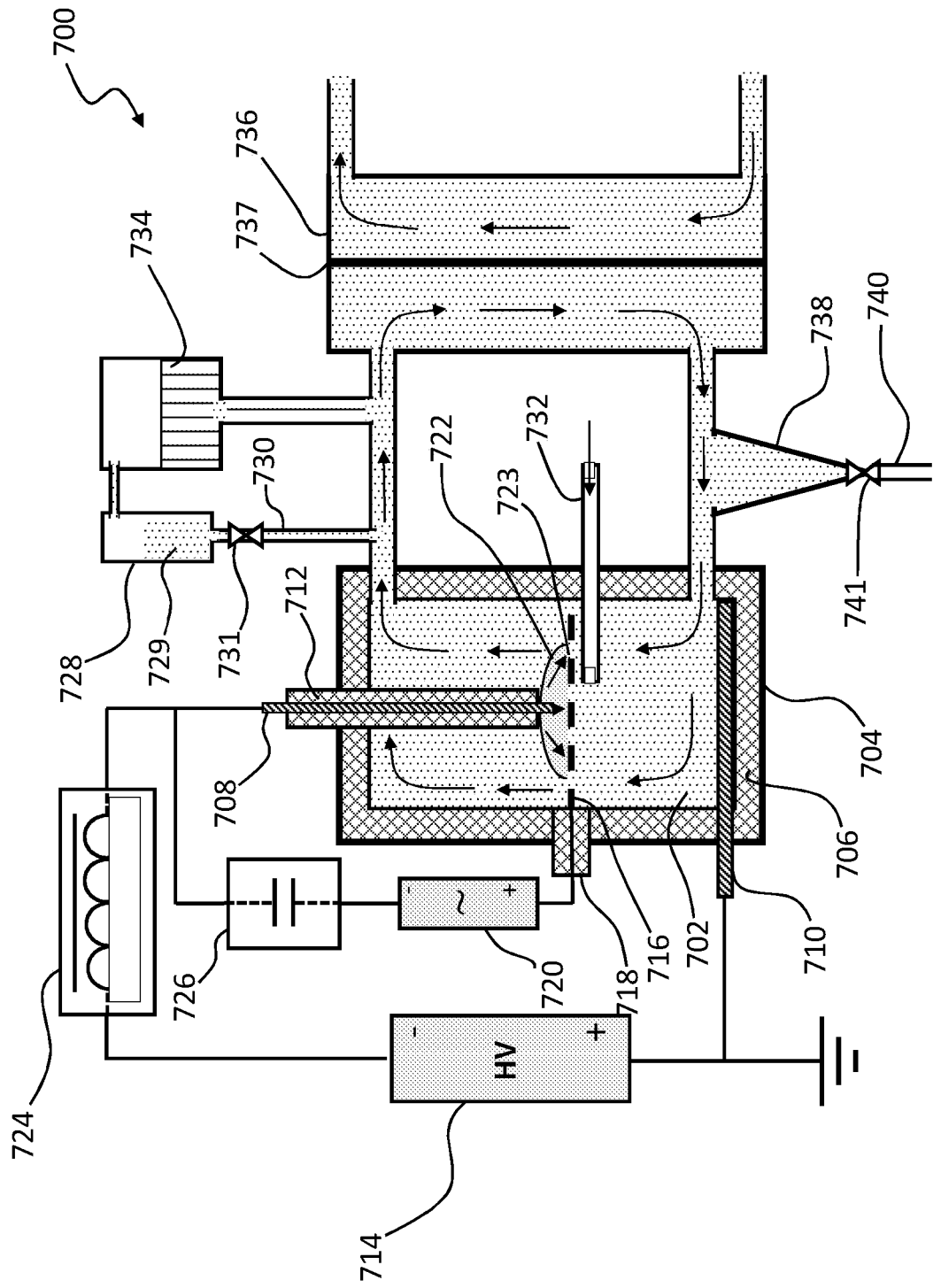
FIG. 7 shows an exemplary first device for plasma treatment of a fluid.

FIG. 7 is a diagram of an exemplary first device 700 for plasma treatment of a fluid. The first device 700 comprises a cathode 708 and anode 710 immersed in a fluid 702. Fluid 702 is confined within vessel 704, and the vessel 704 comprises a layer of insulative material 706. The vessel 704 is made of high-strength materials, such as steel. The insulative material 706 may be made from ceramic, glass or high-temperature plastic.

In the example of FIG. 7, cathode 708 is clad with bushing insulator 712 and adopts a rod-like shape, however other shapes may be used. Cathode 708 is shown oriented perpendicular to anode 710. Stabilizing electrode 716 is interposed between cathode 708 and anode 710, and is clad with bushing insulator 718. In the example of FIG. 7, the stabilizing electrode 416 is shown having a linear, rod-like shape.

A high-voltage (HV) direct-current (DC) power supply 714 is coupled to the cathode 708 and anode 710. DC Power supply 714 is operated at voltages on the order of, for example, >1 kV (often in the range 1-20 kV), and, for example, at currents of >1 A (often in the range of 1-5 A). Additionally, a high-frequency high-voltage alternating current (AC) power supply 720 is coupled to the cathode 708 and the stabilizing electrode 716. AC power supply 716 may be operated, for example, at voltages on the order of 5-10 kV, at currents on the order of 0.02-0.10 A, and at frequencies on the order of 5-30 kHz. Optionally, as outlined above and depending upon plasma conditions, the stabilizing electrode 716 may not be powered by the high-frequency high-voltage AC power supply 720, and so the high-frequency high-voltage AC power supply 720 may be absent. Alternatively, in some plasma conditions, the coupling between the high frequency AC power supply 720 and the stabilizing electrode 716 may be inactive.

As with decoupling inductor 624, decoupling inductor 724 is interposed between cathode 708 and DC power supply 714. As discussed in connection with FIG. 6, decoupling inductor 724 protects the DC power supply 714, by blocking alternating currents and high frequency signals associated with AC power supply 720 from reaching DC power supply 714. Alternatively, the decoupling inductor 724 may be interposed between the DC power supply 714 and the anode 710. In principle, the decoupling inductor 724 may be interposed at any suitable position within the circuit provided the decoupling inductor 724 is in a series arrangement with the cathode 708 and the anode 710.

As with decoupling capacitor 626, decoupling capacitor 726 is interposed between cathode 708 and AC power supply 720. Decoupling capacitor 726 protects the AC power supply 720, by blocking direct currents associated with DC power supply 714 from reaching AC power supply 720. Alternatively, the decoupling capacitor 726 may be interposed between the DC power supply and the anode 710. In principle, the decoupling capacitor 726 may be interposed at any suitable position within the circuit provided the decoupling capacitor 726 is in a series arrangement with the cathode 708 and the anode 710.

Operation of the first device 700 shown in the FIG. 7 is similar to that of the device shown in the FIG. 6. When the DC power supply 714 and AC power supply 720 are switched on, a gas-vapor bubble 722 is formed at the cathode 708, the spark breakdown of which between the cathode 708 and the additional controlling electrode 716 is produced by a high-frequency AC power supply 720.

Inside the gas-vapor bubble 722, a narrow channel conductive spark discharge is formed that provides seed electrons through which a plasma discharge 723 is initiated. The spark discharge occurs inside the plasma discharge. In case of extinction of the plasma discharge 723, a subsequent spark discharge is triggered immediately and automatically under the action of a high-strength electric field between the cathode 708 and the stabilizing electrode 716 produced by high-frequency AC power supply 720 (coupled to the cathode 708 and the stabilizing electrode 716), restoring the plasma discharge 723 in the fluid 702.

When igniting plasma discharge 723 in a saline solution or other electrolyte (for example, an alkali or acid), DC power supply 714 can be operated at voltages on the order of, for example, 0.1-0.5 kV, and at currents on the order of, for example, 15-25 A. The voltage provided by DC power supply 714 can be adjusted by pulse-width modulation with a pulsed supply voltage.

FIG. 7 shows an optional catalyst tank 728 connected to the vessel 704. Catalyst tank 728 holds catalyst 729, which may be in liquid or gaseous form. Catalyst 729 may be delivered into fluid 702 through inlet 730 as fluid 702 circulates around vessel 704. The circulation of fluid 702 around vessel 704 is illustrated by clockwise arrows. Inlet 730 comprises a valve 731 to control the flow of catalyst 729 into vessel 704. Catalyst 729 may facilitate chemical reactions with the plasma discharge 723, in order to improve the efficiency of the treatment of fluid 702. Optionally, a liquid or gaseous catalyst may be delivered into the fluid 702 through tube 732. In the example of FIG. 7, tube 732 is shown interposed immediately beneath stabilizing electrode 716, however tube 732 may be positioned at any suitable point through a sidewall of vessel 704.

An optional fluid extender tank 734 may be connected to vessel 704 and catalyst tank 728. Fluid extender tank 734 serves to prevent rupture of the vessel 704 during any thermal expansion of fluid 702, by providing an overspill tank for fluid 702 as fluid 702 circulates around vessel 704.

The device 700 may further comprise a sump 738. Sump 738 comprises a filter and serves to collect dirt from fluid 702 as fluid 702 circulates around vessel 704. Sump 738 is connected to outlet 740 via valve 741, which allows opening and closing of outlet 740. The contents of the sump 738 may be drained away from device 700 through outlet 740.

Exemplary Device 2

Figure 8:
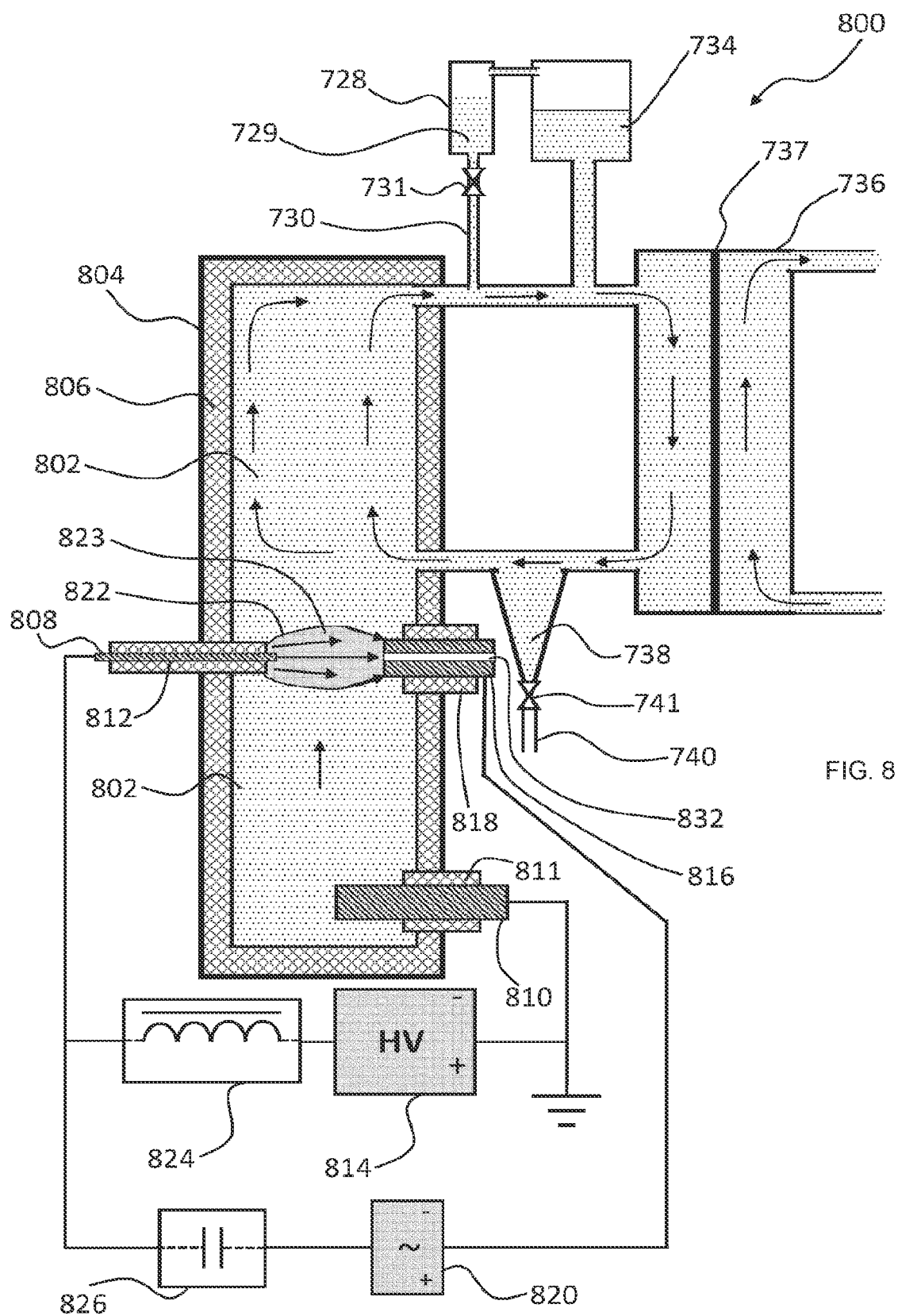
FIG. 8 shows an exemplary second device for plasma treatment of a fluid.

FIG. 8 is a diagram of an exemplary second device 800 for plasma treatment of a fluid. The second device 800 comprises a cathode 808 and anode 810 immersed in a fluid 702. Fluid 802 may the same fluid as fluid 702 shown in connection with FIG. 7, or may be a different fluid. Fluid 802 is confined within vessel 804, and the vessel 804 comprises a layer of insulative material 806. The vessel 804 is made of high-strength materials, such as steel. The insulative material 806 may be made from ceramic, glass or high-temperature plastic.

In the example of FIG. 8, cathode 808 is installed into the vessel 804 through bushing insulator 812 and adopts a rod-like shape, however other shapes may be used. FIG. 8 shows cathode 808 mounted through a sidewall of vessel 804, and, in contrast to FIG. 7, cathode 808 is oriented parallel to anode 810. Anode 810 is mounted into the vessel 804 through bushing insulator 811. Stabilizing electrode 816 is mounted through an opposite sidewall of vessel 804 to cathode 808, and is interposed between cathode 808 and anode 810. Stabilizing electrode 816 is installed into the vessel 804 through bushing insulator 818, which may be made from heat-resistant ceramic, for example.

A high voltage (HV) direct-current (DC) power supply 814 is coupled to the cathode 808 and anode 810. In a similar manner to the electrical circuit arrangement shown in connection with FIG. 7, DC Power supply 814 is operated at voltages on the order of, for example, >1 kV (often in the range 1-20 kV), and, for example, at currents of >1 A (often in the range 1-5 A). Additionally, a high-frequency high-voltage alternating current (AC) power supply 820 is coupled to the cathode 808 and the stabilizing electrode 816. AC power supply 816 may be operated, for example, at voltages on the order of 5-10 kV, at currents on the order of 0.02-0.10 A, and at frequencies on the order of 5-30 kHz. In the example of FIG. 8, the stabilizing electrode 816 is shown having a linear, rod-like shape. Optionally, as outlined above and depending upon plasma conditions, the stabilizing electrode 816 may not be powered by the high-frequency high-voltage AC power supply 820, and so the high-frequency high-voltage AC power supply 820 may be absent. Alternatively, in some plasma conditions, the coupling between the high frequency AC power supply 820 and the stabilizing electrode 816 may be inactive.

In a similar manner to FIG. 7, FIG. 8 shows a decoupling inductor 824 optionally interposed between cathode 808 and DC power supply 814. As discussed in connection with FIGS. 6 and 7, decoupling inductor 824 protects the DC power supply 814, by blocking alternating currents and high frequency signals associated with AC power supply 820 from reaching DC power supply 814. Alternatively, the decoupling inductor 824 may be interposed between the DC power supply 814 and the anode 810. In principle, the decoupling inductor 824 may be interposed at any suitable position within the circuit provided the decoupling inductor 824 is in a series arrangement with the cathode 808 and the anode 810.

In a similar manner to FIG. 7, FIG. 8 shows a decoupling capacitor 826 optionally interposed between cathode 808 and AC power supply 820. Decoupling capacitor 826 protects the AC power supply 820, by blocking direct currents associated with DC power supply 814 from reaching AC power supply 820. Alternatively, the decoupling capacitor 826 may be interposed between the DC power supply 814 and the anode 810. In principle, the decoupling capacitor 826 may be interposed at any suitable position within the circuit provided the decoupling capacitor 826 is in a series arrangement with the cathode 808 and the anode 810.

When switching on the power of the DC power supply 814 and AC power supply 820, a gas-vapor bubble 822 is formed at the cathode 708, the spark breakdown of which between the cathode 808 and the additional controlling electrode 816 is produced by AC power supply 820. Stabilizing electrode 816 is shown horizontally aligned with cathode 808, and gas bubble 822 propagates from cathode 808 towards stabilizing electrode 816. The distance of propagation and dynamics of gas bubble 822 can be controlled by modifying an amount of separation between cathode 808 and stabilizing electrode 816.

Inside the gas-vapor bubble 822, a narrow channel conductive spark discharge is formed, which provides seed electrons through which a plasma discharge 823 is initiated. The spark discharge occurs inside the plasma discharge. In case of extinction of the plasma discharge 823, a subsequent spark discharge is triggered immediately and automatically under the action of a high-strength electric field between the cathode 808 and the stabilizing electrode 816 produced by high-frequency AC power supply 820 (coupled to the cathode 808 and the stabilizing electrode 816), restoring the plasma discharge 823 in the fluid 802.

When igniting plasma discharge 823 in a saline solution or other electrolyte (for example, an alkali or acid), DC power supply 814 can be operated at voltages on the order of, for example, 0.1-0.5 kV, and at currents on the order of, for example, 15-25 A. The voltage provided by DC power supply 814 can be adjusted by pulse-width modulation with a pulsed supply voltage. Operation of the second device 800 of FIG. 8 is analogous to that of the first device 700 shown in the FIG. 7.

FIG. 8 shows an optional catalyst tank 728 connected to the vessel 804. Catalyst tank 728 holds catalyst 729, which may be in liquid or gaseous form. Catalyst 729 may be delivered into fluid 802 through inlet 730 as fluid 802 circulates around vessel 804. The circulation of fluid 702 around vessel 704 is illustrated by clockwise arrows. Inlet 730 comprises a valve 731 to control the flow of catalyst 729 into vessel 804. Catalyst 729 may facilitate chemical reactions with the plasma discharge 823, in order to improve the efficiency of the treatment of fluid 802. Optionally, a liquid or gaseous catalyst may be delivered into the fluid 802 via channel 832 which passes through stabilizing electrode 816. Channel 832 allows the liquid or gaseous catalyst to be fed directly into the plasma discharge 823, between cathode 808 and stabilizing electrode 816.

An optional fluid extender tank 734 may be connected to vessel 804 and catalyst tank 728. Fluid extender tank 734 serves to prevent rupture of the vessel 804 during any thermal expansion of fluid 802, by providing an overspill tank for fluid 802 as fluid 802 circulates around vessel 804.

The device 800 may further comprise a sump 738. Sump 738 comprises a filter and serves to collect dirt from fluid 702 as fluid 702 circulates around vessel 804. Sump 738 is connected to outlet 740 via valve 741, which allows opening and closing of outlet 740. The contents of the sump 738 may be drained away from device 800 through outlet 740.

A distinction between the examples of FIG. 7 and FIG. 8 is that, in FIG. 8, the fluid 802 flow does not necessarily pass through the plasma discharge 823 (as shown by the clockwise arrows). This is because, in the example of FIG. 8, the fluid 802 is at a supercritical temperature, and allowing the fluid 802 to circulate through the plasma discharge 823 could lead to turbulent effects, causing instabilities in the plasma discharge 823 and potentially causing the plasma discharge 823 to extinguish completely. Instead, it has been found to be optimal to circulate fluid 802 around the vessel 804 in a region principally above the plasma discharge 823.

Figure 9:
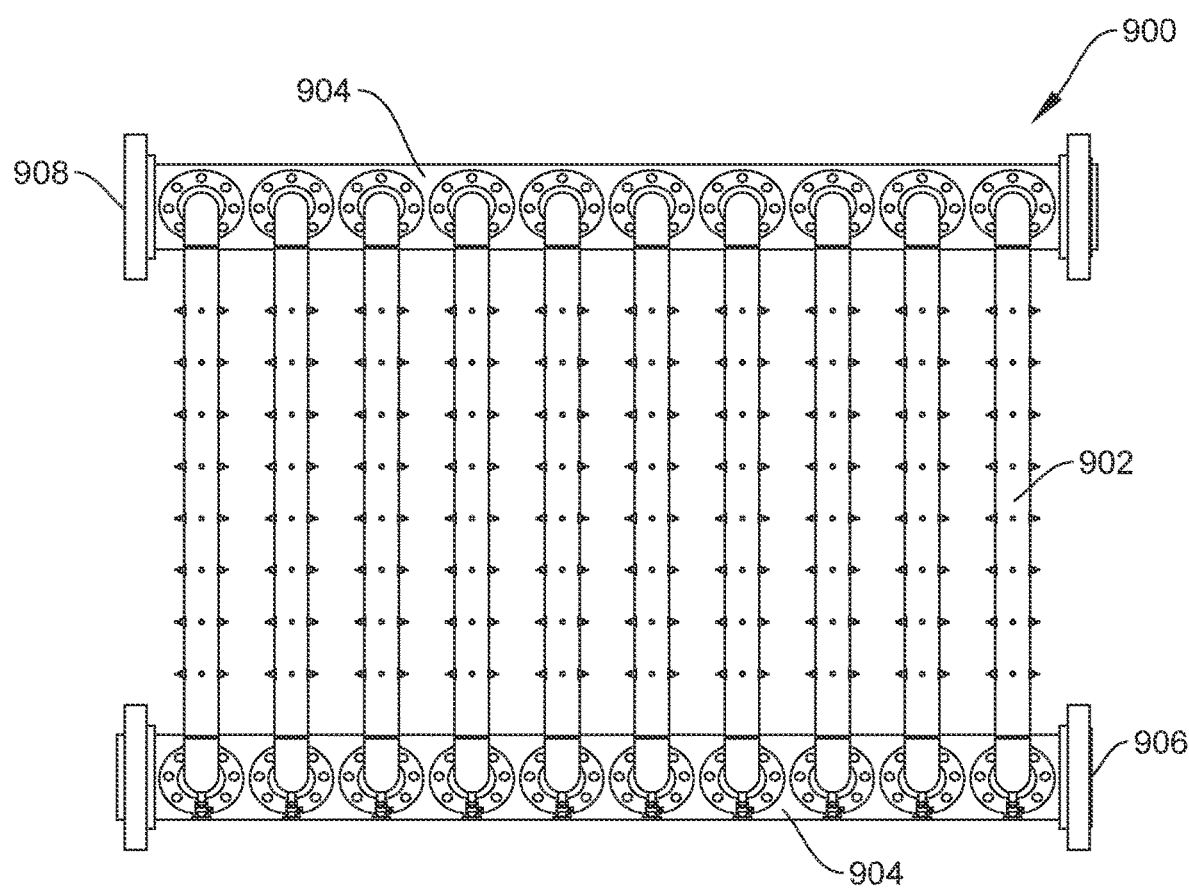
FIG. 9 shows a module comprising multiple treatment devices for plasma treatment of a fluid.

FIG. 9 shows a module 900 comprising multiple devices 902 for plasma treatment of a fluid. Each device 902 may house a multi-electrode system, such as the arrangement of the anode 710, 810 cathode 708, 808 and stabilizing electrode 716 shown in FIGS. 7 and 8. The devices 902 are mounted at opposing ends to manifold 904, which controls the distribution of flow and pressure of the fluid 702, 802. The fluid 702, 802 which may be a liquid, optionally an aqueous solution or water, enters the module 900 via inlet 906, and exits the module 900 via outlet 908. The example of FIG. 9 depicts a module 900 comprising ten individual devices 902, however those skilled in the art will appreciate that any number of individual devices 902 may form module 900, depending upon the particular application.

In one example of use, the fluid 702, 802 to be treated, as shown in FIGS. 7 and 8, may be a liquid, and may optionally be a saline solution. Treatment of the fluid 702, 802 by the plasma discharge may desalinate the fluid 702, 802 to produce water. More specifically, the desalination of the fluid 702 may yield potable water.

In another example, the fluid 702, 802 may be heated as a result of treatment by the plasma discharge. The fluid 702, 802 may be heated past the boiling point of fluid 702, 802 and any excess heat in the fluid 702, 802 may be transferred to heat exchanger tank 736 through heat exchanger 737.

Whilst the above disclosure is in the context of heating or desalinating a fluid using a plasma discharge, the skilled person will appreciate that the techniques and device configurations described herein are equally applicable to the treatment of fluids for alternative purposes.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this application. As such, the foregoing description of embodiments of the present application is not intended to be limiting. Rather, any limitations to the invention are presented in the following claims.

What is claimed is:

1. A plasma generator comprising a cathode, an anode and a stabilizing electrode, wherein the stabilizing electrode stabilizes a region of plasma within a fluid, wherein a high voltage direct current power supply is coupled to the cathode and the anode, and wherein a decoupling inductor is interposed between the high voltage direct current power supply and the cathode.

2. The plasma generator according to claim 1, wherein the stabilizing electrode stabilizes an interface between the region of plasma and the fluid.

3. The plasma generator according to claim 1, wherein the stabilizing electrode initiates the plasma.

4. The plasma generator according to claim 1, wherein the stabilizing electrode is positioned between the cathode and the anode.

5. The plasma generator according to claim 1, wherein the stabilizing electrode emits charged particles into the fluid.

6. The plasma generator according to claim 1, wherein the region of plasma is confined between the stabilizing electrode and the cathode.

7. The plasma generator according to claim 1, wherein a current generated between the cathode and the stabilizing electrode is lower than a current flow from the cathode to the anode.

8. The plasma generator according to claim 1, wherein a potential difference between the cathode and the stabilizing electrode is higher than a potential difference between the cathode and the anode.

9. The plasma generator according to claim 1, wherein the stabilizing electrode has a configuration selected from a plate, a sphere, a rod and combinations thereof.

10. The plasma generator according to claim 1, wherein the stabilizing electrode is porous.

11. The plasma generator according to claim 1, further comprising an inlet for delivering a catalyst to the region of plasma facilitating chemical reaction within the plasma generator.

12. The plasma generator according to claim 1, wherein the fluid comprises a catalyst.

13. A plasma generator, comprising a cathode, an anode and a stabilizing electrode, wherein the stabilizing electrode stabilizes a region of plasma within a fluid, wherein a high voltage direct current power supply is coupled to the cathode and the anode, and wherein a decoupling inductor is interposed between the high voltage direct current power supply and the anode.

14. The plasma generator according to claim 13, wherein the stabilizing electrode stabilizes an interface between the region of plasma and the fluid.

15. The plasma generator according to claim 13, wherein the stabilizing electrode initiates the plasma.

16. The plasma generator according to claim 13, wherein the stabilizing electrode is positioned between the cathode and the anode.

17. The plasma generator according to claim 13, wherein the stabilizing electrode emits charged particles into the fluid.

18. The plasma generator according to claim 13, wherein the region of plasma is confined between the stabilizing electrode and the cathode.

19. The plasma generator according to claim 13, wherein a current generated between the cathode and the stabilizing electrode is lower than a current flow from the cathode to the anode.

20. The plasma generator according to claim 13, wherein a potential difference between the cathode and the stabilizing electrode is higher than a potential difference between the cathode and the anode.

21. The plasma generator according to claim 13, wherein the stabilizing electrode has a configuration selected from a plate, a sphere, a rod and combinations thereof.

22. The plasma generator according to claim 13, wherein the stabilizing electrode is porous.

23. The plasma generator according to claim 13, further comprising an inlet for delivering a catalyst to the region of plasma facilitating chemical reaction within the plasma generator.

24. The plasma generator according to claim 13, wherein the fluid comprises a catalyst.

25. A plasma generator, comprising a cathode, an anode and a stabilizing electrode, wherein the stabilizing electrode stabilizes a region of plasma within a fluid, wherein a high frequency alternating current power supply is coupled to the cathode and the stabilizing electrode, and wherein a decoupling capacitor is interposed between the high frequency alternating current power supply and either the cathode or the anode.

26. The plasma generator according to claim 25, wherein the stabilizing electrode stabilizes an interface between the region of plasma and the fluid.

27. The plasma generator according to claim 25, wherein the stabilizing electrode initiates the plasma.

28. The plasma generator according to claim 25, wherein the stabilizing electrode is positioned between the cathode and the anode.

29. The plasma generator according to claim 25, wherein the stabilizing electrode emits charged particles into the fluid.

30. The plasma generator according to claim 25, wherein the region of plasma is confined between the stabilizing electrode and the cathode.

31. The plasma generator according to claim 25, wherein a current generated between the cathode and the stabilizing electrode is lower than a current flow from the cathode to the anode.

32. The plasma generator according to claim 25, wherein a potential difference between the cathode and the stabilizing electrode is higher than a potential difference between the cathode and the anode.

33. The plasma generator according to claim 25, wherein the stabilizing electrode has a configuration selected from a plate, a sphere, a rod and combinations thereof.

34. The plasma generator according to claim 25, wherein the stabilizing electrode is porous.

35. The plasma generator according to claim 25, further comprising an inlet for delivering a catalyst to the region of plasma facilitating chemical reaction within the plasma generator.

36. The plasma generator according to claim 25, wherein the fluid comprises a catalyst.

37. A method for plasma generation within a fluid, the method comprising:
contacting a cathode and an anode to the fluid;
forming a region of plasma in the fluid;
stabilizing the region of plasma using a stabilizing electrode;
coupling a high voltage direct current power supply to the cathode and the anode; and
interposing a decoupling inductor between the high voltage direct current power supply and the cathode.

38. The method according to claim 37, wherein the fluid is water and the plasma heats the water.

39. The method according to claim 37, wherein the fluid is a saline solution and the plasma desalinates the saline solution to produce water.

* * * * *